(12) United States Patent
Bohn

(10) Patent No.: US 6,188,527 B1
(45) Date of Patent: Feb. 13, 2001

(54) LED ARRAY PCB WITH ADHESIVE ROD LENS

(75) Inventor: David D Bohn, Ft Collins, CO (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/290,131

(22) Filed: Apr. 12, 1999

(51) Int. Cl.$^7$ .............................. G02B 3/06; H01L 33/00

(52) U.S. Cl. .......................................... 359/710; 257/100

(58) Field of Search .................................. 359/642, 665, 359/708, 710, 718, 798–800; 257/98–100, 433; 361/760–761, 765; 438/64

(56) References Cited

U.S. PATENT DOCUMENTS

| H445 | * | 3/1988 | Bock et al. | 264/1.7 |
|---|---|---|---|---|
| 3,805,347 | * | 4/1974 | Collins et al. | 445/24 |
| 4,774,434 | * | 9/1988 | Bennion | 313/500 |
| 4,843,036 | * | 6/1989 | Schmidt et al. | 438/64 |
| 6,054,222 | * | 4/2000 | Takami et al. | 428/417 |

* cited by examiner

Primary Examiner—Georgia Epps
Assistant Examiner—Jordan M. Schwartz

(57) ABSTRACT

The inventive lens is formed from an optical adhesive is used to collect light from a LED array. As the adhesive is dispensed, it is formed into the shape of a lens. The adhesive is then cured, and a lens is formed that covers the LED array. The inventive lens collects light that is emitted by the LEDs at extreme angles and directs the light to the scan location.

11 Claims, 2 Drawing Sheets

LED ARRAY PCB WITH ADHESIVE ROD LENS

BACKGROUND

In scanners and copiers, the light used to illuminate the target area is typically provided by light emitting diodes (LEDs). As shown in FIG. 5, the light emitted from a LED 50 is spread over a large area. The light is emitted at a broad angle, with the half power point 52,53 being 80 degrees from the vertical axis 51.

Thus, most of the light produced by a LED is wasted. Consequently, scanning systems typically employ a collection lens to collect and focus the light onto the target area. As shown in FIG. 6, an LED 61 includes collection lens 63 to collect and focus the light onto target area 31. Note that LED 61 typically comprises a plurality of LEDs arranged in a single column array, and that lens 63 is a cylindrical lens. In FIG. 6, lens 33 is the SELFOC lens array from NSG. The lens 63, is typically an extruded or injection molded plastic lens, e.g. polycarbonate or acrylic. The light reflected from the surface 31 is captured by lens system 33 and focused onto detector 34. FIG. 7 depicts an alternative LED arrangement 71 that uses reflecting optics 72 to reflect the light onto the target area in place of the refracting lens 63 of FIG. 6. The light reflected from the surface 31 is captured by lens system 33 and focused onto detector 34.

The arrangements of FIGS. 6 and 7 are expensive in terms of manufacturing, as each requires additional tooling to attach the lens or reflector to the LED board. Moreover, the lens and reflectors are additional parts which increase cost. Furthermore, note that the lens 63 requires lens mount 62 to attach the lens 63 to the LED 61. This lens mount adds a space requirement to the scan system, and in smaller systems such as a hand-held scanner space is expensive. Also the arrangement of FIG. 7 is also costly in terms of space. For this arrangement to be effective, the trough formed by the reflector 72 must be deep, and thus reflector 72 protrudes from the LED board. Thus, the LED board 81 arrangement shown in FIG. 8 is typically used. Note that there is no light collection optics, instead a bare LED is used to illuminate the target area 31. The light reflected from the surface 31 is captured by lens system 33 and focused onto detector 34. Thus, most of the light produced by LED board 81 is wasted, specifically only about 0.1% of the light is used and about 99.9% of the light is wasted.

Therefore, there is a need in the art for a LED light collection system that is efficient and compact.

SUMMARY OF THE INVENTION

These and other objects, features and technical advantages are achieved by a system and method that uses optical adhesive to form a collection lens.

The optical adhesive is dispensed to cover the LED array. As the adhesive is dispensed, it is formed into the shape of a lens. The adhesive is then cured, and a lens is formed that covers the LED array. A lens shape is formed by the act of dispensing. The combination of gravity, viscosity characteristics of the adhesive, and surface tension characteristics of the adhesive co-act to form the lens shape. Alternatively, a lens form or mold can be used to provide better and more uniform lens shape to the adhesive.

As an example, assume that the LED array is located on a small PC board that is approximately 5 inches long by ¼ inch wide. The LED array is comprised of 18 LEDs evenly spaced in one column on the PC board. The optical adhesive is then dispensed over the LEDs as a long rope of adhesive. Gravity, viscosity, and surface tension cause the adhesive to settle around the LEDs and retain a curved shape. Thus, the adhesive forms an approximately cylindrical lens over the LEDs. The adhesive is then either cured with heat or UV light. Note that the lens formed in this manner is not an accurate lens, as the lens will have irregularities in the lens shape, Moreover, and the shape will not be uniform over the length of the lens, when compared with a standard cylindrical lens. However, the inventive lens does not require the additional manufacturing costs of the prior art lens, nor does the inventive lens require the space of the prior art lens, as the inventive lens is integral with the LED array. Moreover, the inventive lens collects light that is emitted by the LEDs at extreme angles and directs the light to the scan location, and thus provides more light than the prior art arrangement of not using a lens.

Therefore, it is a technical advantage of the present invention to use optical adhesive to form a LED light collection lens.

It is another technical advantage of the present invention to collect light that would be wasted and direct the light to the scan target area. Moreover, the light is diffused by the inventive lens and is more uniformly distributed to the target area. Note that this depends on the composition of the adhesive. Additives in the adhesive would make the light more diffuse. The adhesive would have a "milky" appearance. If the light is more diffuse the system will be slightly less efficient. Thus, there is a trade off between light uniformity and total light output, which depends on the dynamic range of the detector to calibrate out the non-uniformity,.

It is a further technical advantage of the present invention that the lens is integral with the LEDs, and thus does not require attachment to the LED board.

It is a still further technical advantage of the present invention that the invention is inexpensive as the adhesive has a low cost, and additional tooling and/or elements are not required to secure the lens to the array.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF THE INVENTION

Figure 1:
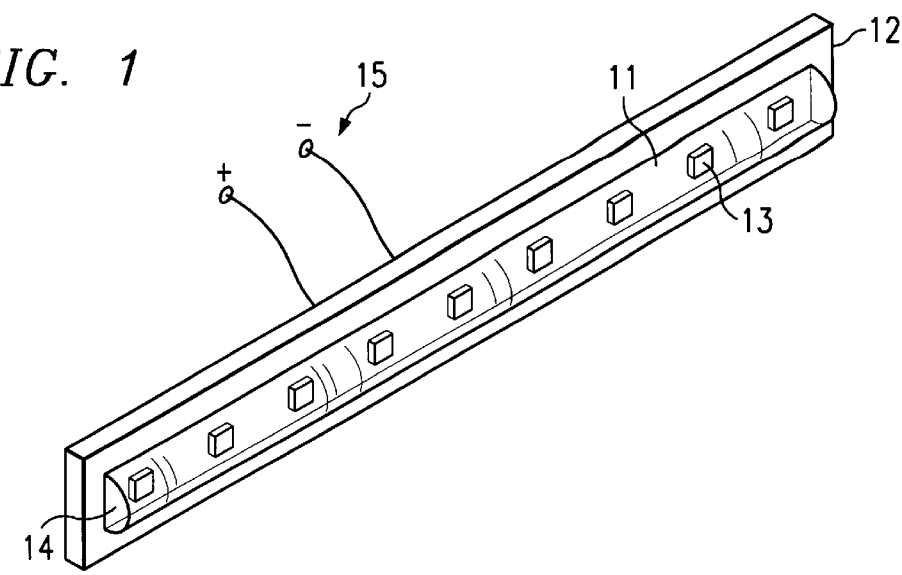
FIG. 1 depicts an isometric view of the inventive lens attached to a LED array.

FIG. 1 depicts an isometric view of the inventive lens 11 attached to a printed circuit (PC) board 12 that includes a plurality of light emitting diodes (LEDs) 13 formed in an array 14. Note that the lens 11 does not require any specific lens mount, as the lens is directly attached to the board 12. The board includes connections 15 to power the PC board 12. The lens 11 is formed by pumping an optical adhesive through a needle directly onto the board 12. The amount of adhesive dispensed determines the size of the lens. The surface tension and viscosity characteristics of the adhesive, as well as the effects of gravity, determine the shape of the lens 11. These characteristics and the effects of gravity co-act to form the crown or cylindrical shape of the lens 11. Specifically, gravity and viscosity cause the adhesive to spread out and form the base of the lens 11 and cover the LEDs 13. Surface tension maintains the curvature or radius of the adhesive on the upper surface during dispensing. After dispensing, lens must be cured, either via heat or ultraviolet (UV) light, to prevent slumping or loss of curvature. Note that curing may not immediately occur after dispensing, depending on the viscosity of the adhesive, it might take some time for the lens shape to form, thus curing takes place after the shape has been formed. Thus, the lens is either passed beneath a UV light or processed through an oven. The overall operation is relatively short, perhaps approximately 10 seconds to dispense, and approximately 30 seconds for UV cure or 30–120 minutes for heat cure. Note that this process will not yield a perfect lens, as the radius will not accurately controlled or duplicated over the length of the lens. However, the inventive lens 11 does provide reasonable light collection results, and it is also very quick and inexpensive. Note that lens 11 also encapsulates and protects the LEDs 13. Further note that the board may be inverted during or subsequent to the dispensing of the adhesive. The inversion would cause gravity to assist in maintaining curvature of the adhesive.

Figure 2:
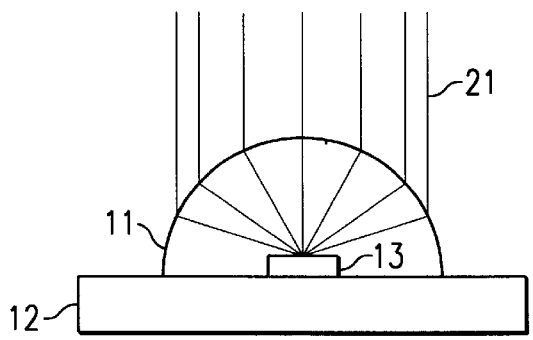
FIG. 2 depicts a cross-sectional view of the inventive lens of FIG. 1.
Figure 3:
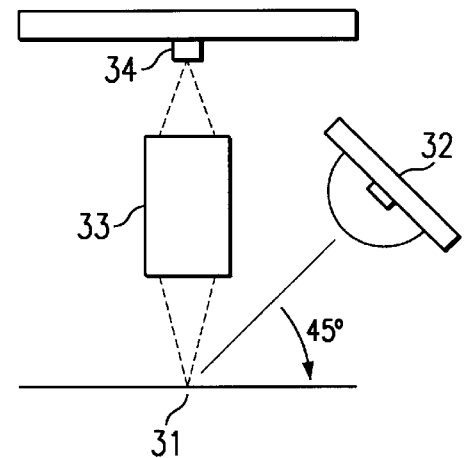
FIG. 3 depicts the inventive lens of FIG. 1 in a scanning system.

As shown in FIG. 2, lens 11 collects light, including light 21 that is emitted from diode 13 at a large solid angle 21. This light is then delivered to the target area, and is used for illumination of scan target 31, as shown in FIG. 3. The inventive lens and PC board 32 is mounted at approximately 45 degrees with respect to and approximately 0.16 inches (or about 4mm) from the scan target surface 31. The light reflected from the surface 31 is captured by lens system 33 and focused onto detector 34. Note that lens 32 does not have to be capable of image quality light delivery, i.e. lens 32 may by a non-imaging lens, as lens 32 is intended to provide more light to surface 31.

The adhesive materials contemplated for use as lens 11 include UV15-7TK1A, UV15X-5, and Sil 410, which are UV cured materials produced by Master Bond, as well as PT1002A/B, which is a heat cured material produced by Pacific Polytech, Inc. Of these materials, UV15 has been shown to perform the best. However, other materials may be used, such as epoxy, urethane, or acrylic, so long as the material has sufficient optical properties to transmit and refract light, at the correct wavelength in the visible range of the spectrum, and sufficient adhesive properties to adhere to the PC board 12. Note that the lens 11 is depicted and described in connection with LEDs, however lens 11 can be used with other elements for other systems, particularly where ever a integral lens with less than perfect optical characteristics can be used.

An alternative lens 11 may be formed using a lens form or mold that has the desired shape. For example, to form the lens shown in FIG. 1, a cylindrical lens form can be applied to the adhesive material. The form may be pressed onto the PC board 12 or the board 12 may be moved through the form. The form would be coated with a non-stick material such as Teflon to prevent the adhesive from sticking to the form. The form would ensure that the lens 11 has an optically correct curvature. The form could be incorporated with the curing system, such that the proper shape is maintained during curing. Note that this system would require more tooling and expense than the simpler system described above, but would produce lenses with accurate and uniform shapes, whereby the lenses would be image capable.

Figure 4A:
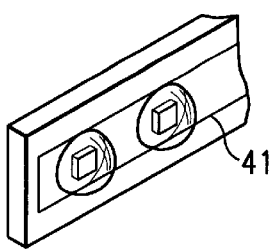
FIGS. 4A–4C depict alterative embodiments for the inventive lens of FIG. 1.
Figure 4B:
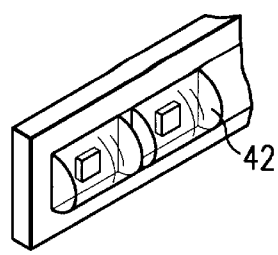

FIG. 4A depicts lens 41 with a plurality of spherical lenses. Note that this lens arrangement will result in more light, it will by extremely non-uniform. The spherical lenses are formed via a lens mold that is pressed onto the adhesive on board 12. The shape and size of the spherical lenses would be selected to concentrate light onto the target area. Note that aspherical lenses may be used to collect more of the off-axis light emitted from the led. Further note that other lens shapes may be used, including cylindrical lense 42 as shown in FIG. 4B. Still further note that a non-lens shape may be pressed onto the adhesive, so long as the light modifier formed collects and bends light. For example, a grating may be formed in the adhesive, which may then collect and focus the light onto the target area.

Figure 4C:
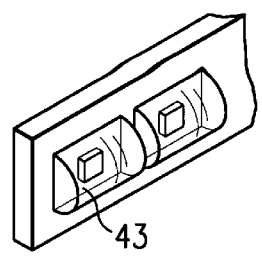
Figure 5:
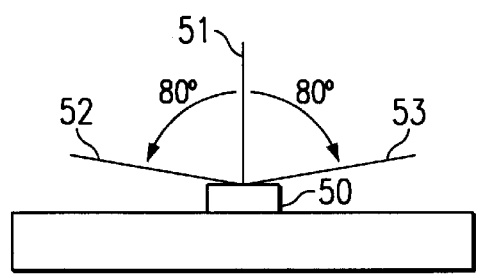
FIG. 5 depicts light emission from a standard LED.
Figure 6:
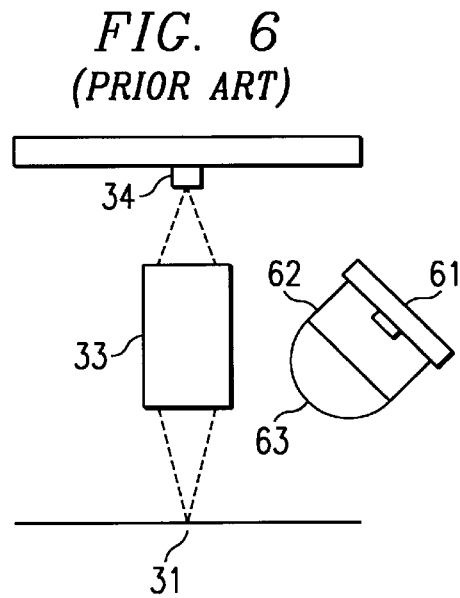
FIG. 6 depicts a prior arrangement of a scanning system with cylindrical collection lens.
Figure 7:
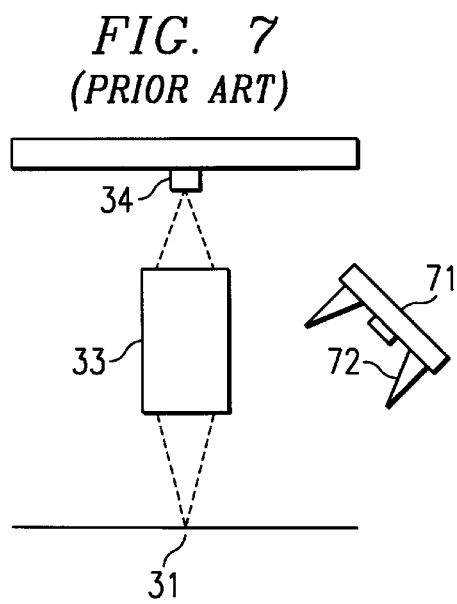
FIG. 7 depicts a prior arrangement of a scanning system with a compound parabolic concentrator.
Figure 8:
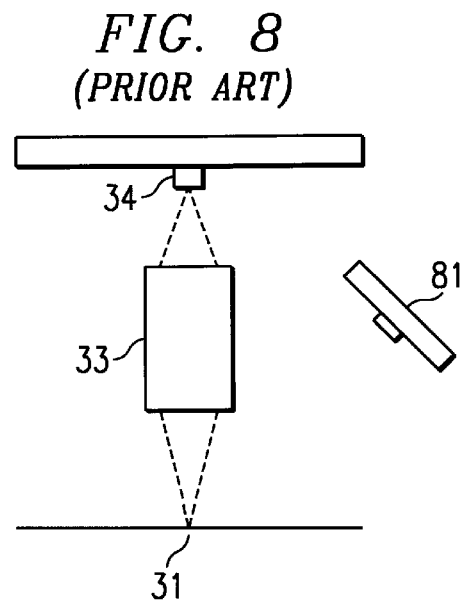
FIG. 8 depicts a prior arrangement of a scanning system without a collection lens.

Another alternative lens 11 may be formed when the LEDs are formed. Note that each individual LED 13 comprises a wire frame with semiconductor material that is encased in an epoxy cube. Instead of encasing the LED in a cube, the LED wire frame would be encased in a lens. Thus, each individual LED wire frame would be placed into a mold that has a lens shape and cured. This would yield LEDS with individual, integral lenses 43, as shown in FIG. 4C. Note that a plurality of LED wire frames could be placed into a larger lens mold to form a single lens array, e.g. as shown in FIG. 1.

Although the present invention and its advantages have been described in detail, it should be understood that various changes, substitutions and alterations can be made herein without departing from the spirit and scope of the invention as defined by the appended claims.

What is claimed is:

1. A method for forming a light collection lens on a board, wherein the board is a printed circuit board that includes a plurality of light emitting diodes (LEDs) arranged in an array, comprising the steps of:

dispensing an optical adhesive onto the array;

forming a lens shape with the adhesive by maintaining the lens shape via the surface tension characteristic of the adhesive wherein the lens shape is a cylindrical lens shape; and curing the adhesive in the lens shape to form the light collection lens.

2. The method of claim 1, wherein the step of curing comprises the step of:

heating the adhesive to a predetermined temperature for a predetermined length of time.

3. The method of claim 1, wherein the step of curing comprises the step of:

exposing the adhesive to a predetermined wavelength of light for a predetermined length of time.

4. The method of claim 1, wherein the light collection lens is used in a scanning system.

5. The method of claim 4, wherein the light collection lens collects light from a light source and directs the light to a scan target.

6. The method of claim 3, wherein the wavelength of light corresponds to ultraviolet light.

7. The method of claim 6, wherein the predetermined length of time is 30 seconds.

8. The method of claim 1, wherein the adhesive is selected from the group consisting of epoxy adhesive, urethane adhesive, and acrylic adhesive.

9. The method of claim 1, wherein the adhesive comprises diffusion additives.

10. The method of claim 1, wherein the method further comprises the step of:

inverting the board subsequent to dispensing the optical adhesive.

11. The method of claim 1, wherein the method further comprises the step of:

inverting the board during dispensing the optical adhesive.

* * * * *